United States Patent
Cho et al.

(10) Patent No.: US 8,271,920 B2
(45) Date of Patent: Sep. 18, 2012

(54) CONVERGED LARGE BLOCK AND STRUCTURED SYNTHESIS FOR HIGH PERFORMANCE MICROPROCESSOR DESIGNS

(75) Inventors: Minsik Cho, Somers, NY (US); Victor N. Kravets, White Plains, NY (US); Smita Krishnaswamy, White Plains, NY (US); Dorothy Kucar, White Plains, NY (US); Jagannathan Narasimhan, Millwood, NY (US); Ruchir Puri, Baldwin Place, NY (US); Haifeng Qian, White Plains, NY (US); Haoxing Ren, Austin, TX (US); Chin Ngai Sze, Austin, TX (US); Louise H. Trevillyan, Katonah, NY (US); Hua Xiang, Ossining, NY (US); Matthew M. Ziegler, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 12/868,086

(22) Filed: Aug. 25, 2010

(65) Prior Publication Data
US 2012/0054699 A1 Mar. 1, 2012

(51) Int. Cl.
*G06F 17/50* (2006.01)
(52) U.S. Cl. ........................ 716/110; 716/104
(58) Field of Classification Search .................. 716/104, 716/110
See application file for complete search history.

(56) References Cited

U.S. PATENT DOCUMENTS

| | | | |
|---|---|---|---|
| 5,491,640 A | 2/1996 | Sharma et al. | |
| 5,896,521 A | 4/1999 | Shackleford et al. | |
| 6,145,117 A * | 11/2000 | Eng ............................ | 716/105 |
| 6,216,252 B1 * | 4/2001 | Dangelo et al. ............. | 716/102 |
| 6,324,678 B1 * | 11/2001 | Dangelo et al. ............. | 716/103 |
| 6,550,042 B1 | 4/2003 | Dave | |
| 6,598,215 B2 | 7/2003 | Das et al. | |
| 6,836,877 B1 * | 12/2004 | Dupenloup .................. | 716/103 |
| 7,124,376 B2 | 10/2006 | Zaidi et al. | |
| 7,210,116 B2 | 4/2007 | Zeidman et al. | |
| 7,290,238 B2 | 10/2007 | Stauffer et al. | |
| 7,376,922 B2 | 5/2008 | Rushing et al. | |

(Continued)

FOREIGN PATENT DOCUMENTS

JP 2005269025 A 9/2005
(Continued)

OTHER PUBLICATIONS

Embedded Multicore Processors and Systems, [online]; [retrieved on Feb. 1, 2010]; retrieved from the Internet http://www.computer.org/plugins/dl/pdf/mags/mi/2009/03/mmi2009030007.pdf?template=1&loginState=1&userData=anonymous-IP%0253A%253A12.157.59.83.

*Primary Examiner* — Suresh Memula
(74) *Attorney, Agent, or Firm* — Cantor Colburn LLP; Preston Young

(57) ABSTRACT

Exemplary embodiments include a computer implemented method for large block and structured synthesis, the method including determining initial design data from starting points for a synthesis flow, receiving user-directed structuring is incorporated into the synthesis flow, applying logical synthesis on the initial design data, applying a physical design on the initial design data, determining whether circuit design parameters have been met and in response to circuit design parameters not being met, adjusting the circuit design parameters.

22 Claims, 11 Drawing Sheets

U.S. PATENT DOCUMENTS

| | | |
|---|---|---|
| 7,565,576 B2 | 7/2009 | Seroff |
| 7,577,822 B2 | 8/2009 | Vorbach |
| 2004/0230920 A1* | 11/2004 | Blinne et al. ............. 716/1 |
| 2005/0149898 A1 | 7/2005 | Hakewill et al. |
| 2005/0289485 A1 | 12/2005 | Willis |
| 2007/0150846 A1* | 6/2007 | Furnish et al. ............. 716/8 |
| 2007/0245280 A1* | 10/2007 | Van Eijk et al. ............. 716/9 |
| 2008/0222595 A1* | 9/2008 | Hsin ............. 716/18 |
| 2008/0276212 A1* | 11/2008 | Albrecht ............. 716/10 |
| 2009/0031278 A1* | 1/2009 | McElvain et al. ............. 716/18 |
| 2009/0055787 A1* | 2/2009 | Oh et al. ............. 716/6 |
| 2009/0112344 A1* | 4/2009 | Nackaerts et al. ............. 700/103 |
| 2009/0300570 A1* | 12/2009 | Chan ............. 716/11 |
| 2010/0058270 A1* | 3/2010 | Steinmetz et al. ............. 716/12 |
| 2010/0223587 A1* | 9/2010 | Huang et al. ............. 716/11 |
| 2010/0318946 A1* | 12/2010 | Hamilton et al. ............. 716/104 |
| 2011/0022998 A1* | 1/2011 | Rao et al. ............. 716/108 |
| 2011/0035712 A1* | 2/2011 | Gaugler et al. ............. 716/105 |
| 2011/0055792 A1* | 3/2011 | Pandey et al. ............. 716/131 |
| 2011/0154279 A1* | 6/2011 | Caldwell et al. ............. 716/103 |
| 2011/0302547 A1* | 12/2011 | Mottaez ............. 716/132 |

FOREIGN PATENT DOCUMENTS

| | | |
|---|---|---|
| WO | 2006012335 A2 | 2/2006 |
| WO | 2008044211 A1 | 4/2008 |

* cited by examiner

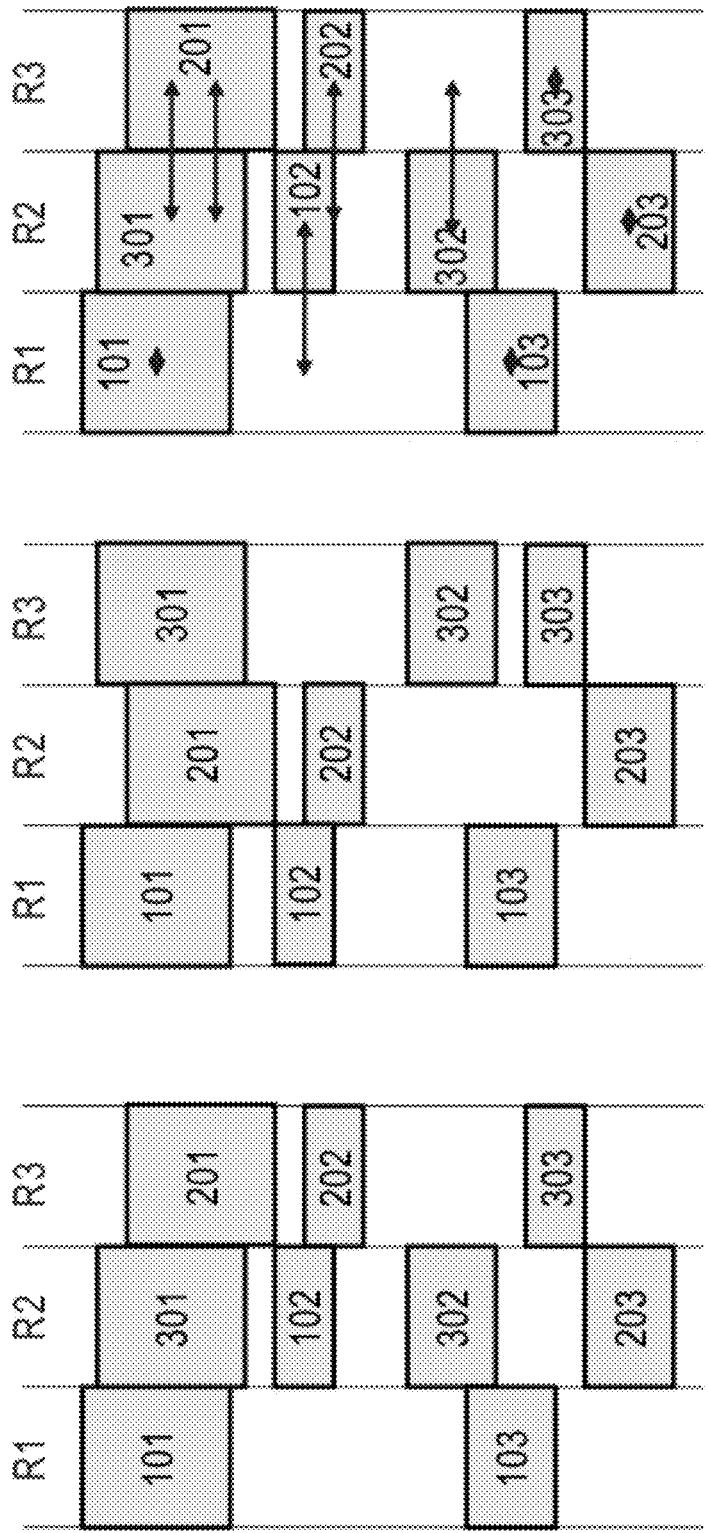

Path Attractions

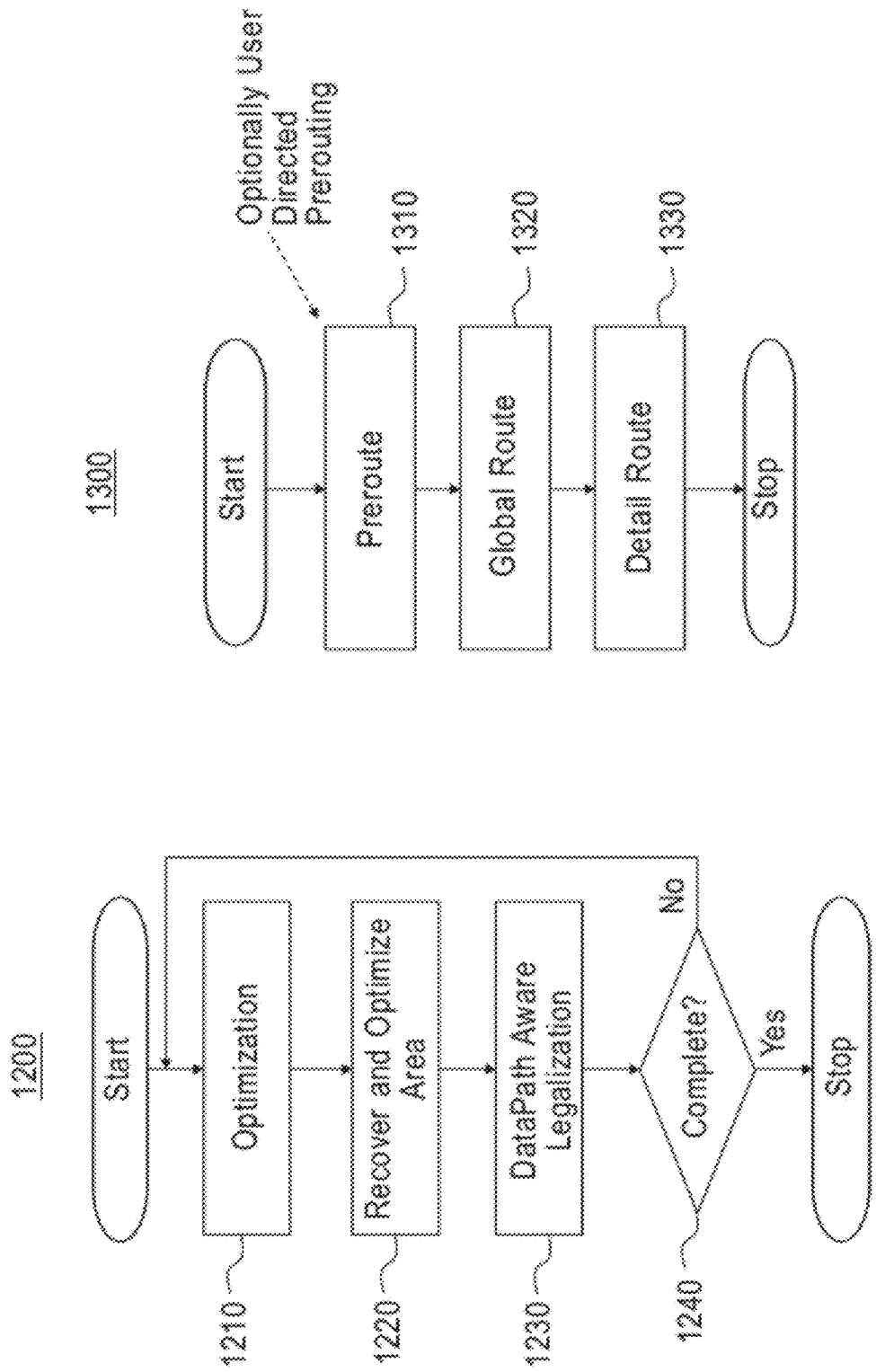

CONVERGED LARGE BLOCK AND STRUCTURED SYNTHESIS FOR HIGH PERFORMANCE MICROPROCESSOR DESIGNS

BACKGROUND

The present invention relates to logic circuit design, and more specifically, to systems, methods and computer program products for converged large block synthesis and structured synthesis for high performance microprocessor designs.

Conventionally, manually intensive custom design has been considered essential to achieving high-performance in microprocessor designs. In addition, for practical reasons, the microprocessor designs are typically partitioned into "macros" small enough for one person to design. The process of completing and checking a macro's physical design is labor-intensive, and does not support the detailed exploration of multiple options. Therefore, almost all physical design follows the completion of high-level design (HLD): the initial logic design and a floorplan establishing the partitioning, size and placement of the macros. Inevitable later logic changes are usually accommodated within the initial partitioning. These decisions are reflected in all aspects of the design process, both technical and organizational (i.e., assignment of resources and project management). The high volume of microprocessors justifies the cost-intensiveness of the manually custom designs.

The conventional manual custom design approach to microprocessor design can therefore be inefficient, preventing high level-optimization and exploration of different design alternatives.

SUMMARY

Exemplary embodiments include a computer implemented method for large block and structured synthesis, the method including determining initial design data from starting points for a synthesis flow, receiving user-directed structuring is incorporated into the synthesis flow, applying logical synthesis on the initial design data, applying a physical design on the initial design data, determining whether circuit design parameters have been met and in response to circuit design parameters not being met, adjusting the circuit design parameters.

Additional exemplary embodiments include a computer program product for large block and structured synthesis, the computer program product including instructions for causing a computer to implement a method, the method including determining initial design data from starting points for a synthesis flow, receiving user-directed structuring is incorporated into the synthesis flow, applying logical synthesis on the initial design data, applying a physical design on the initial design data, determining whether circuit design parameters have been met and in response to circuit design parameters not being met, adjusting the circuit design parameters.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 7-10 illustrate examples of datapath gates in accordance with exemplary embodiments;

FIG. 12 illustrates a flowchart for an in-place optimization method in accordance with exemplary embodiments;

FIG. 13 illustrates a flowchart for a routing method in accordance with exemplary embodiments;

DETAILED DESCRIPTION

In exemplary embodiments, the systems and methods described herein drive design optimization of microprocessors through high-level optimization, including placement of components and layout of data-flows, with the capability to re-optimize the design efficiently and explore different design alternatives. Initial physical design with synthesis is included in architecture closure. The exemplary design flows described herein allow circuit solutions to timing problems to be captured without freezing a detailed physical hierarchy or floorplan. Therefore, it is feasible to start tentative floorplanning and synthesis during HLD. Feedback from that physical design is available to evaluate proposed logic changes. The flexible physical design, high degree of automation, and high-level control of design elements enable timing closure with minimal custom circuit design effort.

In exemplary embodiments, the systems and methods described herein implement large high performance logic through a structure in synthesis. As such, the exemplary systems and methods described herein implement a converged methodology of both physically larger blocks with structures in them. Structured portions of the large circuit netlist are first derived in order to implement the critical logic portions. The structured portion of the large circuit netlist is then physically implemented in a regular layout. The large circuit netlist in then physically implemented by embedding the structure in synthesis in a physically larger block. The rest of the logic that is non-critical around the structured portions of large logic netlist is then synthesized. In exemplary embodiments, the systems and methods described herein increase synthesis productivity by synthesizing more manually intensive custom logic beyond conventional synthesis, and remove artificial constraints imposed by a hierarchy to enable larger macros. As such, there is decreased dependence on manually intensive top level unit integration and the proposed method is able to meet timing in a smaller area. Through elimination of white space, hierarchical boundaries are removed and custom components with standard cells are efficiently packed. The convergence of large block synthesis and structured synthesis enables designers to focus on smaller sets of critical elements. In contrast, current logic circuits, such as processors, implement a collection of fine-grained macros. The exemplary embodiments described herein implement larger random logic macros (RLMs) designed by the converged large block synthesis and structured synthesis methods described herein. The highly automated design flow of the exemplary systems and methods raise the level of abstraction of the design at the physical level in which larger blocks of logic can be optimized globally with embedded custom macros. This allows exploration of more optimal power-performance-area tradeoff.

Figure 1:
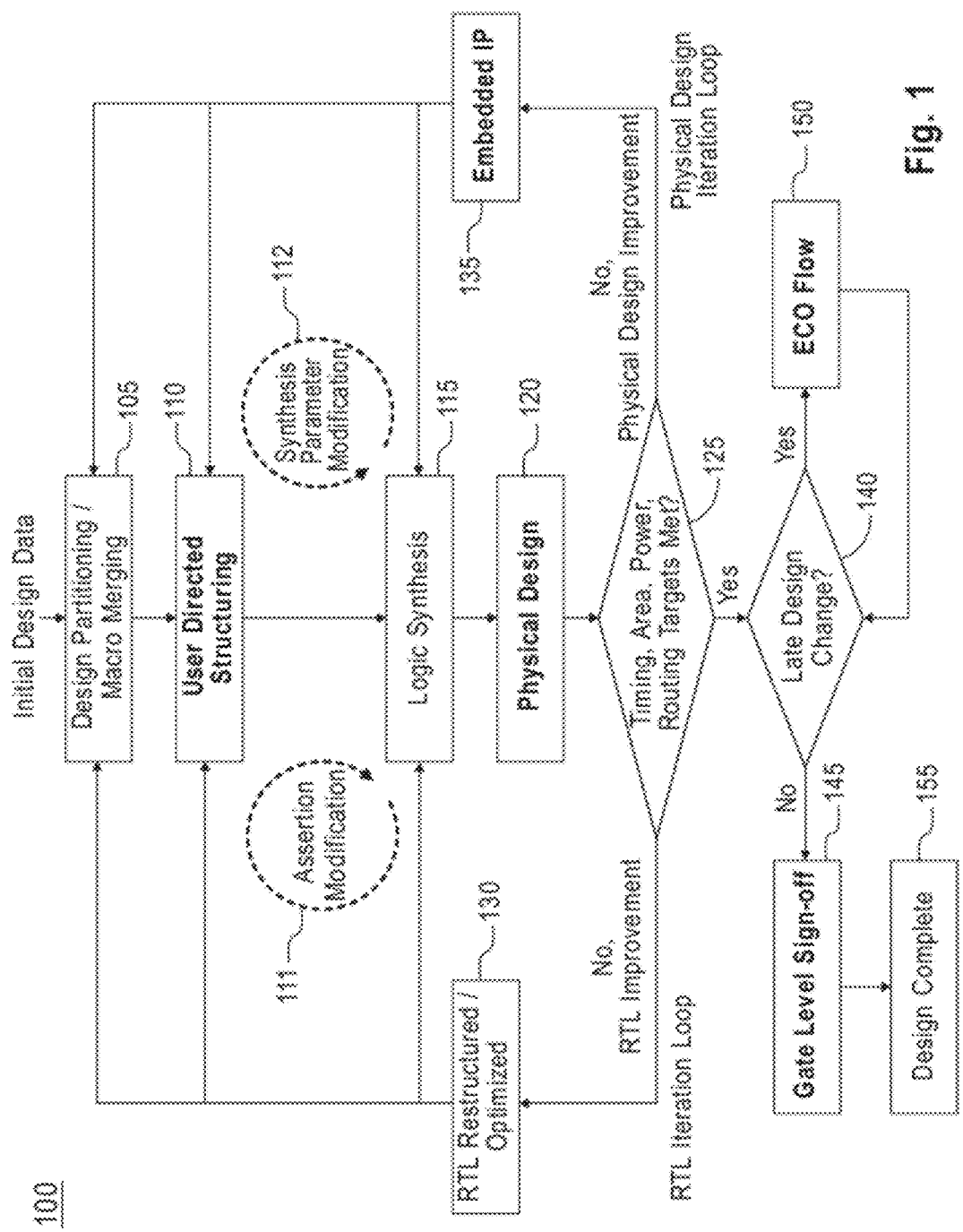
FIG. 1 illustrates a flowchart for Large Block and Structure Synthesis in accordance with exemplary embodiments.

FIG. 1 illustrates a flowchart of a method 100 overview for large block and structured synthesis (LBSS) in accordance with exemplary embodiments. It is appreciated that prior to implementing the method 100, the processor or other integrated circuit that is synthesized is logically designed (i.e., RTL entry is completed). In exemplary embodiments, the initial step to the LBSS method 100 is to determine the appropriate partitioning for the design. Since LBSS designs are larger than conventionally synthesized high performance designs, the initial design data can originate from starting points including top-down partitioning and bottom-up macro merging. Several of the blocks of method 100 are described further herein. At block 105, the initial design data is implemented for design partitioning/macro merging. At block 110, user-directed structuring is incorporated into the synthesis flow. At block 115, logic synthesis is performed on the data. In the method 100, assertion modification 111, and synthesis parameter modification 112 can be performed routinely between blocks 110, 115 and as the synthesis flow continues as described herein. At block 120, physical design is implemented which includes structured synthesis as described later. At block 125, the method 100 determines whether several parameters in the circuit design have been met. The parameters can include, but are not limited to: timing, area, power and routing targets. If at block 125, the parameters are not met and it is determined that register transfer logic (RTL) improvement is needed, then at block 130, the RTL is restructured and optimized, and the method 100 continues at blocks 105, 110, 115, and as described herein. If at block 125, the parameters are not met and it is determined that physical design improvement is needed, then at block 135, the embedded IP is modified, and the method 100 continues at blocks 105, 110, 115, and as described herein. Those skilled in the art understand that embedded IP is a term referring to the implementation of pre-designed hardware that can be embedded in another design and describe and implement hardware functionality. Additional iteration loops that can improve synthesis results include assertion modification 111 and synthesis parameter modification 112. If at block 125, the parameters are met, then at block 140, the method 100 determines if there have been late design changes. If there have been no late design changes at block 140, then at block 145 the method 100 implemented gate level sign-off and the circuit design is complete at block 155. If at block 140, there are late design changes, then at block 150 engineering change orders (ECO) are performed until all late design changes have been met at block 140.

Figure 2:
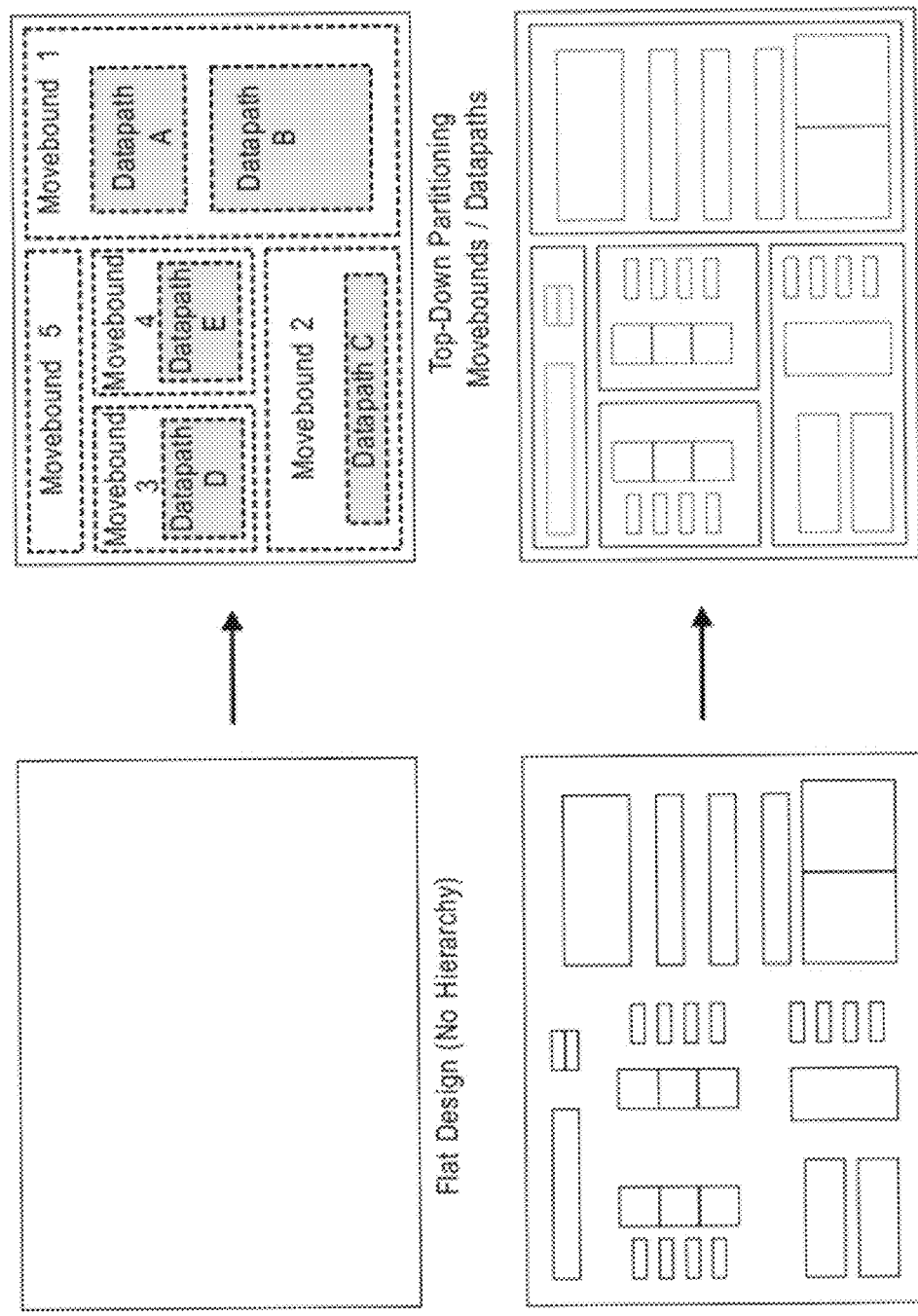
FIG. 2 illustrates examples of design partitioning/macro merging in accordance with exemplary embodiments.

In exemplary embodiments, top-down partitioning begins with a complete unit or subunit that would typically be integrated by a human designer prior to the LBSS methods. If design partitioning is not performed, these large designs are synthesized "flat", meaning synthesis operates on the complete design, without consideration of localized groups defined in hierarchical designs. However, large "flat" synthesized designs may lead to non-optimal results due to a lack of local structure. Often the localized groupings defined in hierarchy can provide global structure and guidelines during synthesis. This global view is typically not captured in conventional synthesis algorithms. Given a large flat design, one design approach available in the LBSS methods described herein is to create "movebounds" to constrain placement of certain objects within a specific boundary. The movebounds can be employed to create a "virtual hierarchy" by grouping objects that exhibit local connectivity and/or belong to the same logical function. Movebounds can either: 1) be automatically created by the LBSS methods, 2) be manually specified by the LBSS user. Another partitioning technique is datapath synthesis. Datapath synthesis partitions the design into datapath regions and non-datapath regions. Datapath synthesis is described further herein. Datapath synthesis also enables 1) automated datapath partitioning and/or 2) user defined datapaths using "Subgroup" specifications. In exemplary embodiments, movebounds can be considered a courser grain partitioning mechanism, where as datapath partitioning is a finer grain technique. For example, a common approach is to constrain the LBSS design by multiple movebounds, then, within each movebound, datapath and non-datapath regions provide finer partitioning, as illustrated in FIG. 2, which illustrates examples 200 of design partitioning/macro merging in accordance with exemplary embodiments. In exemplary embodiments, both movebound and datapath constraints are low overhead "floorplanning" techniques. In both cases, the techniques can either be automated by the LBSS methods or supplied by the user at various levels of detail. In cases where the user supplies floorplanning details, the process can be performed prior physical design at block 120 in FIG. 1. Automated floorplanning can also be performed within physical design at block 120.

In exemplary embodiments, bottom-up macro merging can begin with a number of macros that were previously designed as individual pieces of hierarchy. The goal of this technique is to merge the macros into a larger LBSS design. The benefit of larger merged designs include: 1) more flexibility for synthesis to optimize across macro boundaries; 2) a reduced dependence on design data and external analysis between the small macros (e.g., timing requirements (unit timing and assertions)); and 3) a lower number of total designs and interface data to maintain, (e.g., assertions and physcells). Macro merging combines the VHDL, physcells, and assertions for specified smaller macros into larger LBSS design. This is a semi-automated process within the LBSS flow. As opposed to the "virtual hierarchy" techniques described above, merging macros is higher overhead, but provides a true "hard" hierarchy. Advantages to the hard hierarchy boundaries are that multiple designers can work on different pieces of hierarchy in parallel and that the merged blocks can be reused (i.e., instantiated multiple times within a larger design). The result of macro merging is to create input data to the LBSS methods including, but not limited to: 1) RTL representation (VHDL); 2) Boundary and pin positions (physcell); and 3) Boundary timing constraints (assertions). In exemplary embodiments, this input design data can be implemented for all designs entering synthesis, including the top level design during a top-down partitioning process. However, individual partitions often do not require this input design data, which reduces the overhead of managing the "virtual hierarchies" created from the top-down. Top-down and bottom-up partitioning are not exclusive and can be mixed in numerous ways. For example, a number of small macros can be merged into a larger LBSS design, but movebounds can be applied to the merged design to retain some degree of local structure. In this case, the movebounds can then be modified to explore different local grouping and movebound sizes.

Figure 3:
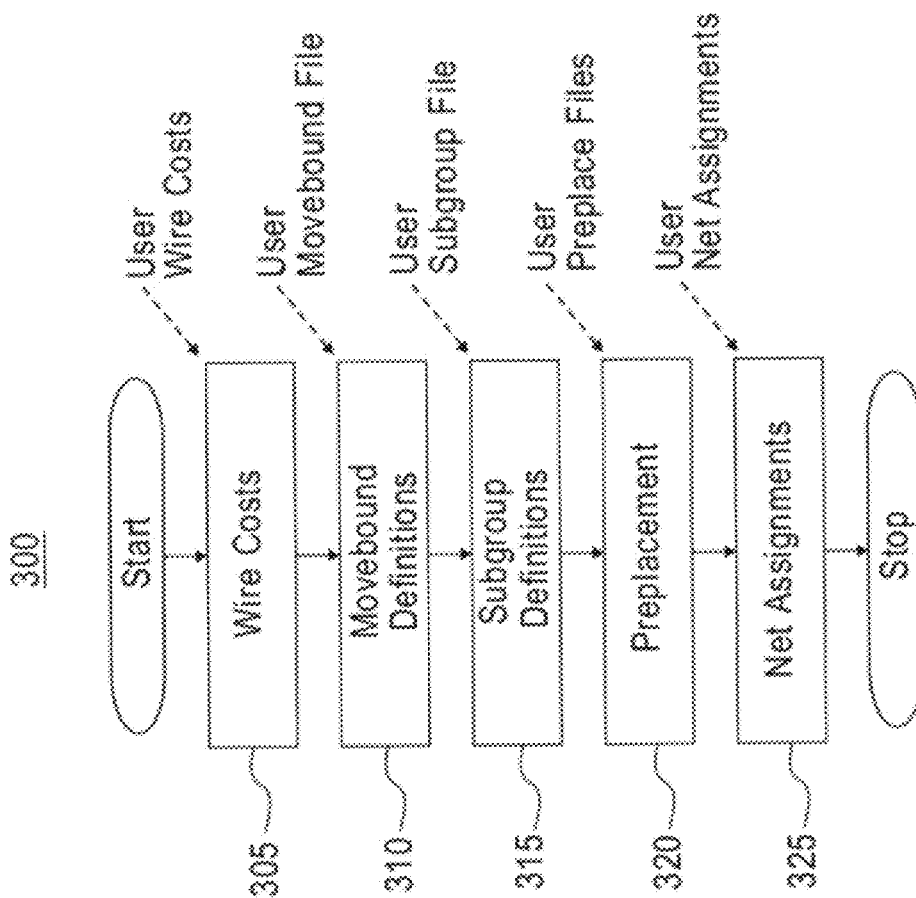
FIG. 3 illustrates flowchart of a method for implementing user-directed structuring in accordance with exemplary embodiments.

Referring again to FIG. 1, user-directed structuring is now described in more detail. Prior to running synthesis or during design iteration, the user may want to add specific structuring to the design, which allows the user to supply either hard or soft constraints to synthesis. FIG. 3 illustrates flowchart of a method 300 for implementing user-directed structuring in accordance with exemplary embodiments. At block 305, the user can allow the user to assign generic wire cost functions. At block 310, the user can specify movebounds that locally constrain the placement of instances within a boundary. At block 315, the user can provide subgroup definitions. Subgroups are user defined datapaths. A subgroup region is defined by user by specified net and/or pin locations, which creates localized datapath partitions. Datapath synthesis then processes the subgroups as datapath. At block 320, the user can perform preplacement, which enables the user to directly specific the placement of specific instances. Preplacement can involve standard cell logic gates, latches, LCBs (local clock buffers), and embedded blocks. At block 325, the user can make net assignments, which enables the user to assign specific wirecodes to net names and/or net names matched by regular expressions. The wirecodes influence optimization during synthesis as well as provide requirement to the router.

Referring again to FIG. 1, physical design at block 120 is now described in further detail. In exemplary embodiments, the LBSS methods described herein can include floorplanning that can automate the partitioning efforts typically performed by human designers. The LBSS methods, however, still provide mechanisms for the user to either partially or completely specify floorplanning directives. In small block synthesis methodology, the location of the blocks and the critical path between the blocks can be precisely controlled. However, as designs become larger without hierarchy or partitioning, gates are placed flat, which means a gate can be placed anywhere within the macro boundary. Although ideally the placer should place gates on a critical path close to each other, in reality, gates can be placed far away from each other due to the complexity of the placement problem. If the gates are placed too far away, wire delay is going to dominant the critical path delay, which is one of the drawbacks of large flat designs. The LBSS methods described herein enable the movebound mechanism to constrain the placement to achieve the similar effect of small block methodology. The user can provide the movebound specification directly as described herein, which is also referred to a "custom" movebound. The tool can also automatically generate the movebounds.

Figure 4:
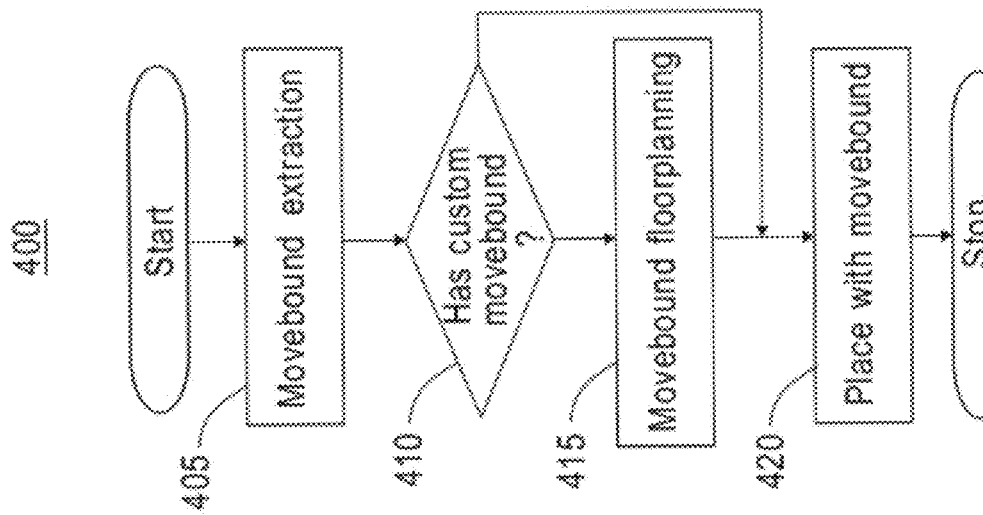
FIG. 4 illustrates an LBSS movebound method in accordance with exemplary embodiments.

FIG. 4 illustrates an LBSS movebound method 400 in accordance with exemplary embodiments. In exemplary embodiments, movebound extraction at block 405 rebuilds the original hierarchy and extracts gates belonging to the sub macros of the original hierarchy from the flattened netlist. These sub macros are the candidates for movebound selection. A movebound can cover one sub macro or multiple sub macros. Because synthesis would alter the netlist structure, the original hierarchy boundary is often diluted and cannot be extracted exactly. Therefore the extraction only provides an approximate hierarchy compared to the original one. The outcome of the movebound extraction is the gate assignment for each movebound, and based on the assignment, the estimated area for each movebound. If a custom movebound is assigned at block 410, movebound extraction does not compute the movebound area, but it still needs to create gate assignment for each movebound. If a custom movebound is not specified by the user, then movebound floorplanning computes the floorplan of the movebounds at block 415 (i.e. define the location and aspect ratio of each movebound). Otherwise, if custom movebound is specified at block 410 the floorplanning step can be skipped and placement with movebound can be complete at block 420. Many existing floorplanning algorithms can be used to generate such a floorplan. Placement with movebounds is implemented at block 420, in which the placer supports the movebound constraints, which is not limited by the placement algorithm or how they implement the movebound constraints. If a user needs to run multiple placement steps within the physical design flow and the netlist structure is modified between each placement steps, then the method 400 can be repeated within each placement steps.

Figure 5:
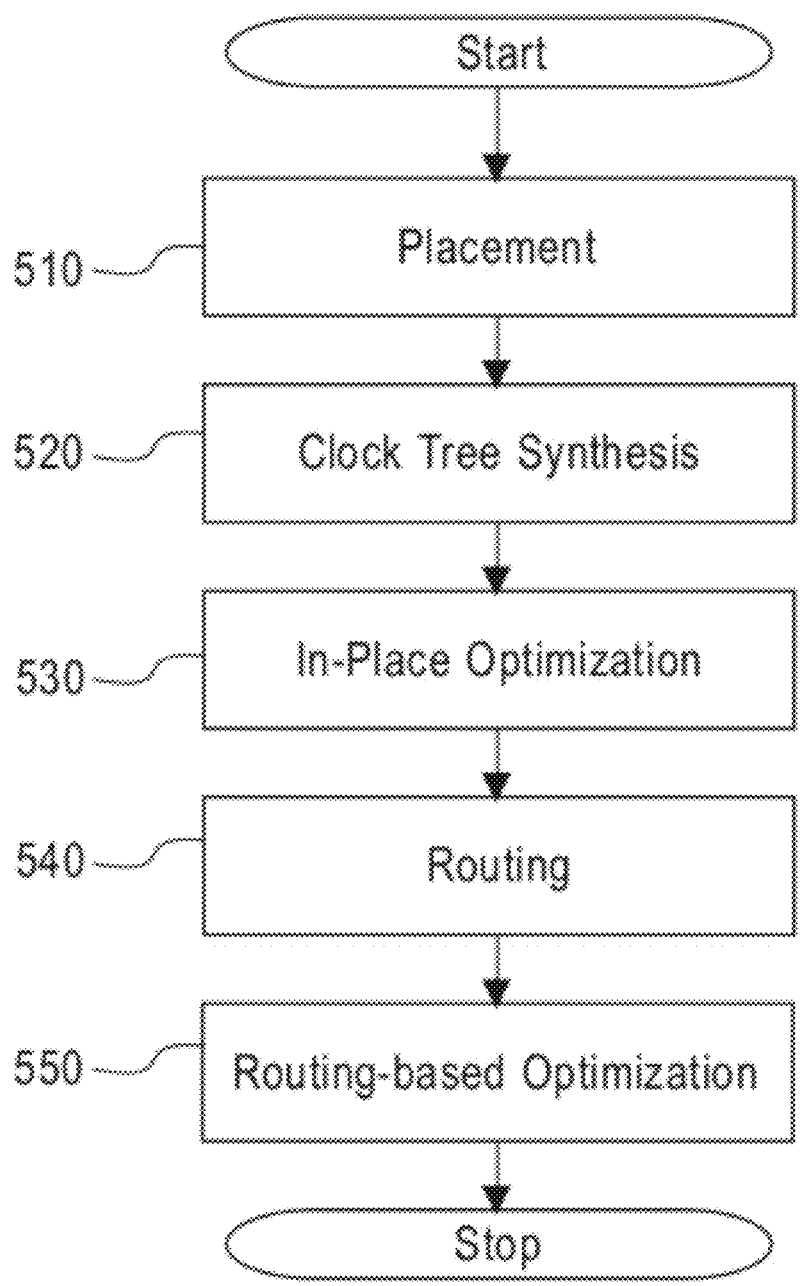
FIG. 5 illustrates a flowchart for a method of physical design in accordance with exemplary embodiments.

Referring still to block 120 in FIG. 1, physical design can further be divided into several blocks as now described with respect to FIG. 5, which illustrates a flowchart for a method 500 of physical design in accordance with exemplary embodiments. At block 510, the method 500 includes placement, where all the gates are placed on the given macro boundary. At block 520, the method 500 includes clock tree synthesis, where clock buffers are inserted to drive various latches. At block, 530, the method 500 further includes in-place optimization, where buffers are inserted and gates are resized to meeting timing and electrical constraints. At block 540, the method 500 further includes routing, where wires are routed between logically connected gate pins and macro terminals. At block 550, the method 500 includes routing-based optimization where timing is re-optimized based on actually parasitic extracted after routing. In a conventional physical design flow, clock tree synthesis is usually performed after in-place optimization. But for high performance design with short cycle time, clock trees have tight slew requirements and clock buffers are relatively large. Inserting clock trees after in-place optimization might change the design large enough that in-place optimization needs to be done again. Therefore, in exemplary embodiments, clock tree synthesis is implemented prior to the in-place optimization. Furthermore, structured clock tree synthesis is implemented to build high performance clock routing.

Figure 6:
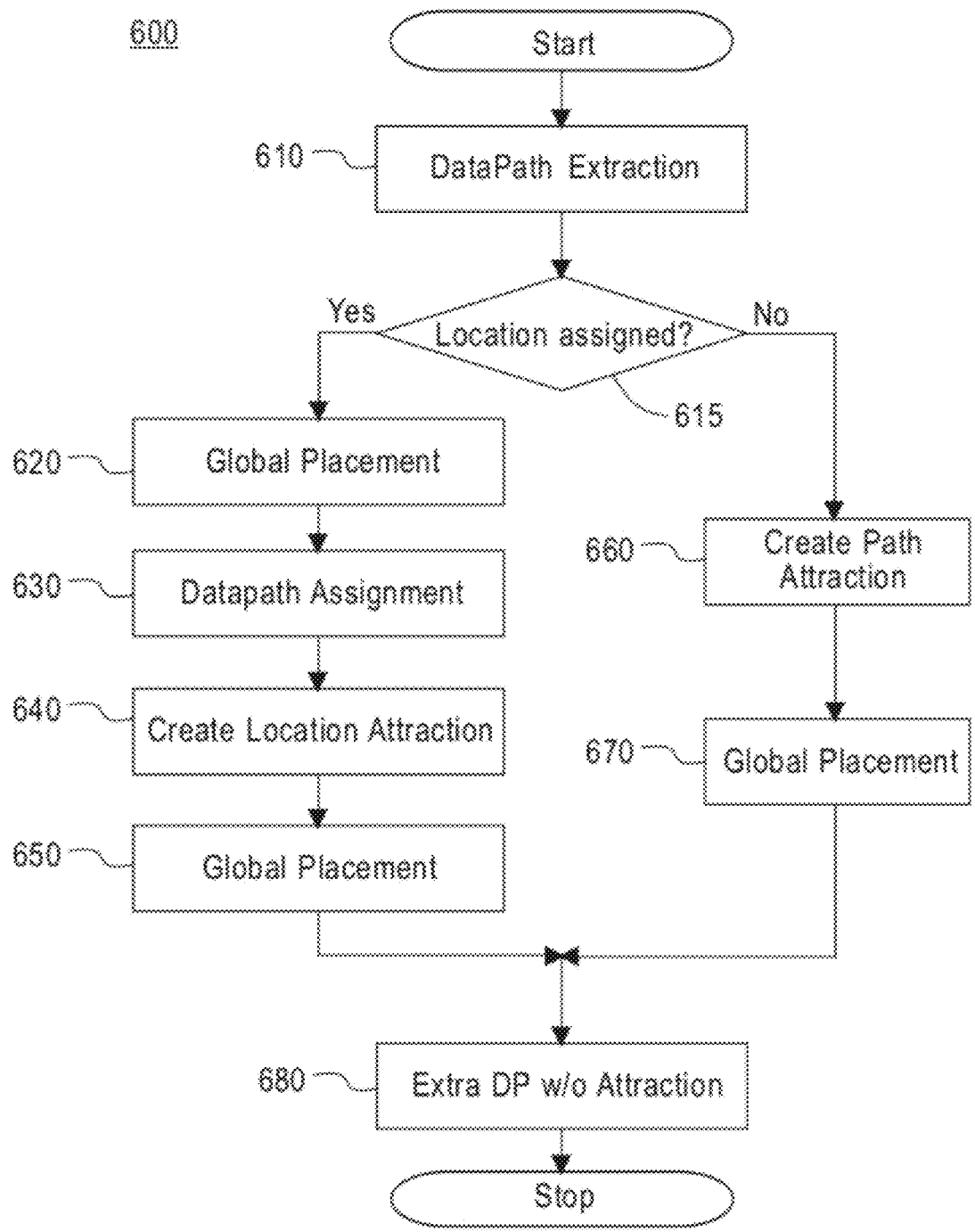
FIG. 6 illustrates a flowchart for a structured placement and synthesis method in accordance with exemplary embodiments.

FIG. 6 illustrates a flowchart for a placement method 600 (block 510 in FIG. 5) in accordance with exemplary embodiments. At block 610 datapath extraction is performed as described herein. In exemplary embodiments, the output of datapath extraction is many sets of gates that need to be lined up within each set. Depending on the extraction algorithm, the sets of gates may or may not be assigned to a particular circuit row. At block 615, the method 600 determines if locations are assigned. If there are locations assigned at block 615, then at block 620, the method 600 performs global placement, datapath assignment 630 at block 630, local attraction creation at block 650, and global placement again at block 650. Then at block 680, extra datapaths without attraction are generated. If at block 615, there is no location assigned, then at block 660, the method 600 creates path attraction and performs global placement at block 670. Then at block 680, extra datapaths without attraction are generated.

Figure 10:
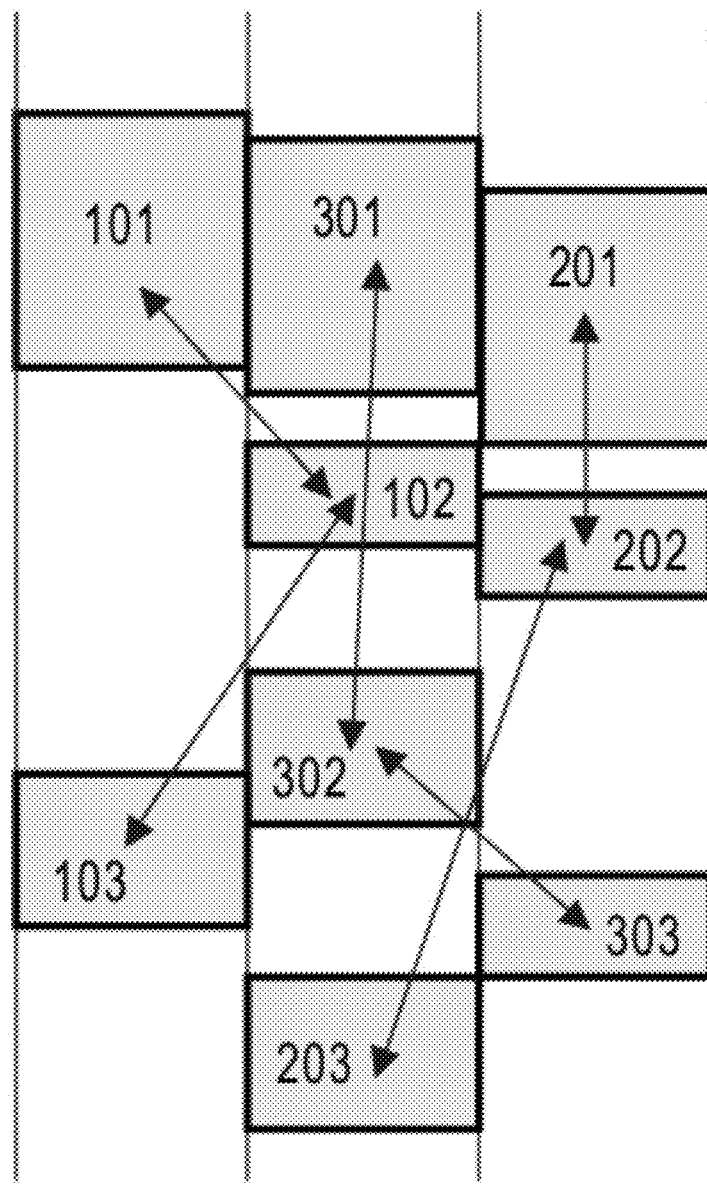

For example, in FIGS. 7-9, there are nine datapath gates, 101, 102, 103, 201, 202, 203, 301, 302, 303. Gate 101, 102, 103 are a set of gates assigned to circuit row R1; gates 201, 202, 203 are assigned to R2 and gates 301, 302, 303 are assigned to R3. If the gates are assigned to a specific circuit row, it first runs a global placement algorithm (e.g. quadratic placement algorithm or force-directed placement algorithm), then it moves the extracted datapath gates to its assigned circuit rows horizontally (for vertical circuit row) or vertically (for horizontal circuit row). As show in FIG. 8, gate 201 is horizontally moved from R3 to R2, and gate 301 is horizontally moved from R2 to R3. Then it creates attraction, a virtual net connection, between the new location and the gate. In FIG. 9, attractions are created for each gate, for example, there is an attraction from gate 301 to its assigned location on R3. These attractions are then fed back to the next global placement block. The next global placement tries to place those gates near to the assigned locations as close as possible based on the attractions while globally optimize the total wirelength. If the datapath gate location is not assigned, it creates attractions between the gates of the same path. These attractions pull those gates together in subsequent global placement block. For example in FIG. 10, there are three paths identified by datapath extraction. Gate 101, 102, 103 form one path, gate 201, 202, 203 form the other, and gate 301, 302,303 form the third. Attractions are created between gates of the same path, e.g. 101 and 102, 102 and 103. When the end points of the datapath are fixed in place, these attractions straighten up the datapath. At end, an extra wirelength driven detailed placement step is applied without the constraints of any attraction to further improve the wirelength.

Figure 11:
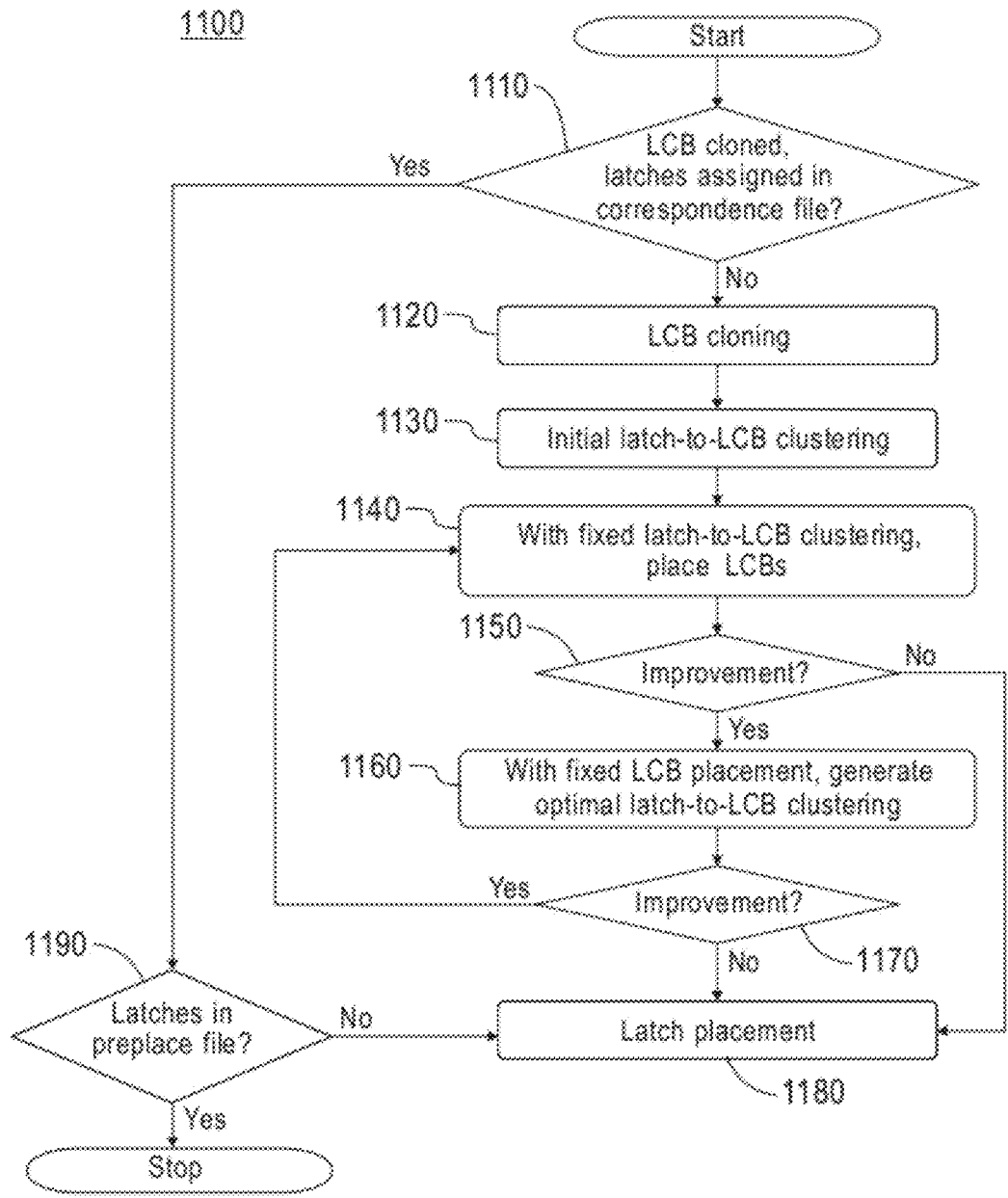
FIG. 11 illustrates a flowchart for a clock tree synthesis method in accordance with exemplary embodiments.

FIG. 11 illustrates a flowchart for a clock tree synthesis method 1100 (block 520 in FIG. 5) in accordance with exemplary embodiments. The method 1100 first includes a determination of whether or not there are LCB cloned, latches in assigned in a correspondence file (defining user directed instructions) at block 1110. If there are no LCB cloned, latches in assigned in a correspondence file at block 1110, then the method 1100 performs LCB cloning at block 1120, and initial latch-to-LCB clustering at block 1130. At block 1140, the method 1100 then places the LCBs with fixed latch-to-LCB clustering. At 1150, the method 1100 determines if there is improvement. If there is improvement, then with fixed LCB placement, the method 1100 performs optimal latch-to-LCB clustering at block 1160. Improvement is then tested again at block 1170. If there is improvement the method continues at block 1140. If there was no improvement at blocks 1150, 1170, the method 1100 continues to latch placement at block 1180. Furthermore, if there are LCB cloned, latches in assigned in a correspondence file at block 1110, then the method determines if there are latches in the preplace file at block 1190. If there are no latches in the preplace file at block 1190, then latch placement is performed at block 1180. If there are latches in the preplace file at block 1190, then the method 1100 skips automated placement for the latches in the preplace file and places the latches as directed by the preplace file. In exemplary embodiments, the task of the LCB placement is to determine the locations of LCBs and the latch groups driven by each LCB, while the objectives are to minimize the latch-placement distortion when latches are pulled towards the LCBs and to place LCBs as close to macro clock pins as possible, under constraints such as LCB fanout limit, blockages, and the like. The LCB placement task is therefore broken into two sub-problems and solved iteratively, as shown in the FIG. 11. The sub-problem of latch-to-LCB clustering at block 1130 is a standard bipartite matching problem, and can be solved either as a min-cost-max-flow formulation or as a linear program. The sub-problem of placing LCBs at block 1180 is essentially a 2D legalization problem with large and non-rectangular objects, each of which is one LCB plus the structured latch stacks that it drives; and there exist preferred LCB locations under macro clock pins. Specialized legalization heuristics can be implemented to solve this sub-problem. Although the solution within each sub-problem can be globally optimal, the overall iterative solution is a greedy procedure and stops at the first local-optimum that it encounters. To reduce such sub-optimality, multiple runs of the iterative algorithm are conducted with randomized initial-guess solutions, and the best of the multiple outcomes is selected as the final solution. After determining the LCB placement, the structured latch placement problem includes finding the best location for each latch in the user-specified latch structures, and simultaneously minimizing the timing degradation due to latch displacement, which is as well a bipartite matching problem, and can be solved either as a min-cost-max-flow formulation or as a linear program.

FIG. 12 illustrates a flowchart for an in-place optimization method 1200 (block 530 in FIG. 5) in accordance with exemplary embodiments. The goal of in-place optimization is to optimize the design for criteria like timing, area and power from the previous placement step block 510 in FIG. 5). Conventional in-place optimization has only two steps: optimization and legalization. During optimization, transforms such as buffer insertion, gate resizing change the netlist locally. These transforms usually work on two timing modes: late mode for setup timing problems and early mode for hold timing problems. For 65 nm and later technologies, multi-mode multi-corner timing optimization is often required. To give transforms the maximum flexibility, resulting placement is not required to be legal (i.e. transforms could introduce overlaps between gates). It is up to a separate legalization step to remove those overlaps and produce a legal placement. In-place optimization often runs multiple iterations of optimization and legalization steps until certain design closure objectives are satisfied. For datapath, the placement density is often very high (i.e. over 90 percent). Conventional legalization engines are likely to move many gates a long distance in order to remove the overlaps in high utilization macros. Furthermore, conventional legalization engines do not model datapath differently to regular logic, therefore datapath gates are often misaligned after legalization. In exemplary embodiments, the legalization engine is datapath aware, which honors the structure of datapath and handles high utilization macros pretty well. The details of datapath aware legalization are described herein. As such, at block 1210, the method 1200 performs optimization as described herein. At block 1210, the method 1200 recovers and optimizes are as described herein. At block 1230, legalization is performed in accordance with exemplary embodiments. At block 1240, the method 1200 determines if the optimization is complete. If optimization is not complete at block 1240, then the method repeats at block 1210. If at block 1240, the method 1200 determines that optimization is complete, the method 1200 ceases.

FIG. 13 illustrates a flowchart for a routing method 1200 (block 540 in FIG. 5) in accordance with exemplary embodiments. Conventional routing consists of global routing and detailed routing steps. In global routing, macros are divided into many routing grid and wires are assigned to these routing grids. In detailed routing stage, wires are actually wired inside their assigned routing grids. In exemplary embodiments, the method 1300 includes prerouting at block 1310, in which special wires are routed prior to the global routing step. The special wires guide global and detailed routing to find the best routing for special nets such as local clock nets, long select lines, and high fanout buffer trees. The preroutes can be optionally supplied by a user. Then at block 1320 global routing is performed and at block 1330, detailed routing is performed, as described herein.

In exemplary embodiments, the wire resistance and capacitance used to compute timing during in-place optimization (see FIG. 12) can be based on Steiner tree estimation. After routing, the actually extracted numbers are different to those used before, often worse due to the scenic routes, which can cause the timing criteria unsatisfied after routing even they were during in-place optimization. As such, the netlist is re-optimized based on the real parasitic information, which can be referred to as routing-based optimization. During routing-based optimization, whenever a change is made to the netlist, the routes change accordingly before next round timing calculation (i.e. new wires are created and old wires are modified). The route changes ensure that the extracted parasitics are still accurate. Also during routing-based optimization, gates are changed only if it does not create overlaps to other gates, and new gates are inserted only if there are empty slots to place them. Because of this restriction, legalization can be skipped, unlike in-place optimization. Similar to in-place optimization, routing-based optimization also supports multi-mode optimizations.

Figure 14:
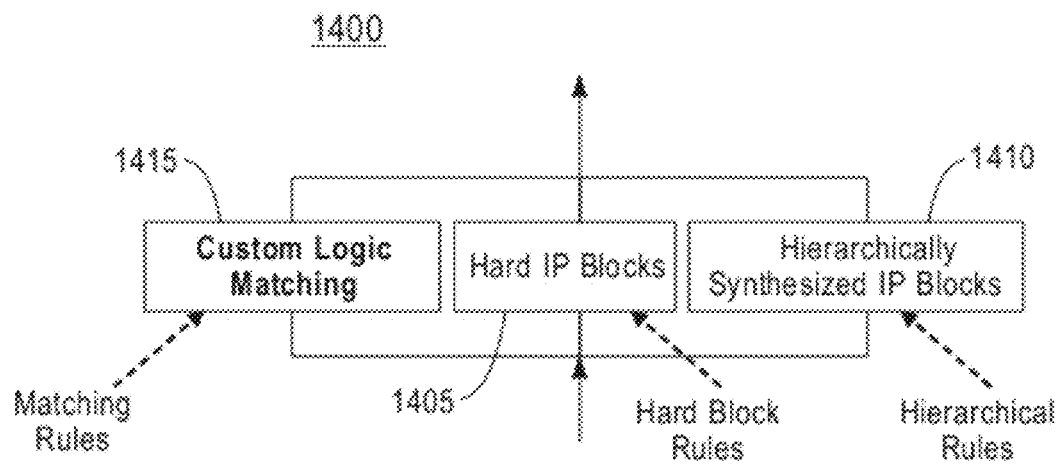
FIG. 14 illustrates a diagram of different embedded IP option branches in accordance with exemplary embodiments.

Referring again to FIG. 1, embedded IP is implemented at block 135 if physical design improvements are required at block 125. In exemplary embodiments, embedded IP at block 135 provides options for customizing the circuit design. Embedding IP involves supplying additional design data that is not natively available to synthesis. FIG. 14 illustrates a diagram 1400 of different embedded IP option branches in accordance with exemplary embodiments. Different branches 1405, 1410, 1415 are presented since each instance of embedded IP takes one form. However, a circuit design may have multiple instances of embedded IP of different forms. In exemplary embodiments, the embedded IP option branches 1405, 1410, 1415 are available within the LBSS methods. In exemplary embodiments, hard IP blocks 1405 are instances that are fully completed custom components that are instantiated in the in larger LBSS designs. The user supplies a physical design and timing rule to synthesis. In addition, the user precisely specifies the instances in the LBSS should be replaced by the hard IP blocks. In exemplary embodiments, hierarchically synthesized IP blocks 1410 are instances that are synthesized subcomponents that are instantiated in the larger LBSS design. The user requirements are similar to hard IP blocks, except a timing rule is not required. Synthesis is able to time through the hierarchy of the synthesized subcomponent. In exemplary embodiments, custom logic matching 1415 are IP blocks that can also be automatically recognized during the LBSS flow. In this case, the designer supplies physical design data as well as a matching pattern to synthesis. Synthesis then determines subcomponents that can be instantiated in the LBSS design. This process removes the need for the designer to precisely specify which instances in the LBSS design should be replaced.

Figure 15:
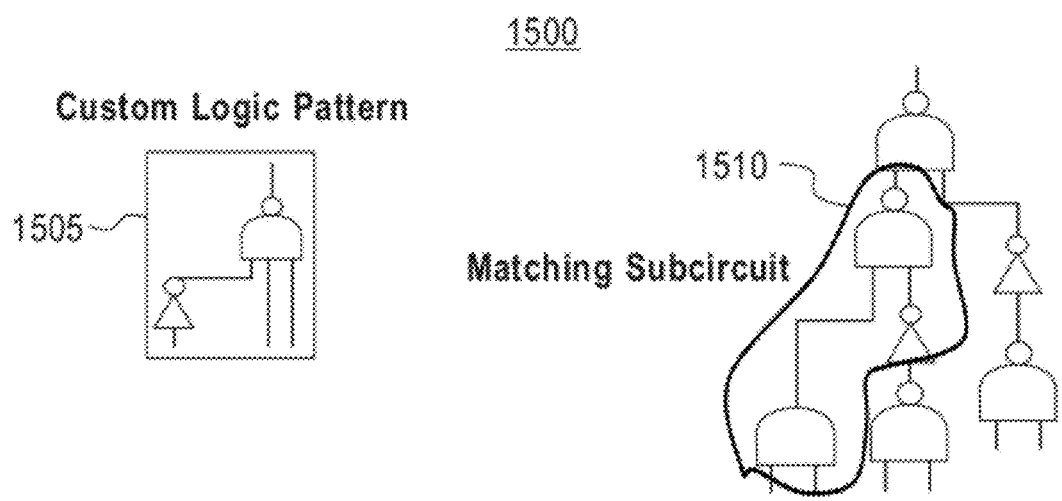
FIG. 15 illustrates an example custom logic pattern and matching subcircuit in accordance with exemplary embodiments.

In the exemplary LBSS methods described herein, specialized logic patterns have specific known ways of placement and synthesis that yield better performance, power, or area than random synthesis/placement algorithms. In this portion of the flow, the user supplies custom logic patterns as well as other specific rules which the LBSS methods implement to automatically match to portions of the logic during synthesis. For example, FIG. 15 illustrates an example custom logic pattern 1505 and matching subcircuit 1510. Examples of such custom logic patterns can include adders, rotators, comparators, etc. However, it is appreciated that the custom logic patterns can be any logic equation.

Recognition of the above-described logic is now described. In exemplary embodiments, areas of interest are isolated in the large block implementing graphical properties of the netlist. In neighborhoods around the areas of interest, functional hashing is implemented to search for potential subcircuits that realize the same functionality as the custom logic pattern. Next, verification is performed to determine whether candidate subcircuits indeed realize the same functionality as the custom logic pattern. In exemplary embodiments, Boolean matching can be implemented in the verification process. (Given two logic circuits, A and B, Boolean matching is the problem of finding an ordering O and a set of negations N of the inputs and outputs of A, such that A becomes functionally equivalent to B. If no such ordering or negations exist, then A and B do not realize the same functionality.)

In identifying isolating areas of interest, promising areas of logic are identified implementing graphical properties, such as fanout counts, or certain patterns of gate connections to isolate areas of interest where we search for the custom logic pattern. For instance, most arithmetic structures are implemented using many XOR gates. Hence, areas around XOR clusters can be marked as a region of interest. Likewise, decoders are characterized by high fanout, and high fanout regions can be marked in a search for decoders.

In verifying candidate subcircuits, all subcircuits around the area of interest that have the same number of inputs and outputs as the custom logic pattern in question are enumerated. Then, each such subcircuit is hashed under a signature which includes characteristics of the Boolean function(s) realized by the subcircuit. Pertinent characteristics of Boolean functions can include minterm counts, cofactor minterm counts, number of input symmetry classes, and sizes of the input symmetry classes. Candidates that hash to the same signature as the custom logic pattern are checked using a Boolean matching algorithm known in the art. In particular, most Boolean matching algorithms rely on a superset of the characteristics that are computed for identified signatures. Hence, the signature essentially pre-performs an approximate and fast form of Boolean matching to prune candidates.

Embedded IP methodology can also be present in the above-described LBSS methods. Two examples are discussed. For both examples implementing adjustment steps, location of the embedded custom within the larger LBSS design is not known until final placement, so the adjustments are steps that occur after placement, but before routing.

In one example, clock pin placement adjustment for embedded blocks can be implemented. The clock pin placement of LBSS designs is handled from a bottom-up perspective, as opposed to the top-down flow used in many ASIC flows. The bottom-up clock pin placement flow allows the clock input pins to the embedded block to be placed independently of the clock network in the LBSS design. When the embedded block is placed within the top level LBSS design, the top level clock pin placement automatically adjusts to accommodate the clock pins in the embedded custom instance. The adjustments may involve deleted clock pins at the LBSS level that were original placed over top of the embedded instance, the addition of top level clock pins at other positions to replaced deleted pins, and bubbling of the embedded IP clock pins to the top level LBSS design.

In another example, power grid adjustment for embedded blocks can be implemented. The power grid of embedded block may not match the power grid of the top level LBSS design. In this example, the power grid of the LBSS design is automatically adjusted to allow the embedded block to be placed within the top level LBSS design.

Referring again to FIG. 1, ECO flow is implemented at block 150 if there are late design changes at block 140. In VLSI design process, specifications are often changed in order to correct design errors and accommodate changes, or to meet certain design constraints such as area, timing, and power consumption. Since a large engineering effort may already have been invested (e.g., the layout of a chip may have been completed), it is desirable that these changes in specification do not lead to a very different design. Furthermore, part of the masks (i.e. the front end of line (FEOL)), might have already been manufactured when the specifications changed, which leaves the designer no choice but to only change the rest of masks, i.e. the back end of line (BEOL), to implement the changes. Therefore it is required that the changes are exactly the same on the FEOL masks, but only different at the BEOL masks. To implement an ECO, the common approach is to manually insert/delete/modify the existing gates and their connections to make them equivalent to the new specification. This approach is very time consuming and error-prone for large blocks. Because the number of ECOs potentially for each large block is much more than those of small blocks and the manual effort to fix each ECO in a large block is also much harder than those of smaller blocks, the combined effect is that doing manual ECO in large block is extremely difficult. Therefore, an automated approach is a must to have for large block synthesis. The changed logic needs to be identified in order to efficiently and automatically implement an ECO. Once the changed the logic is identified, most of physical design tools can place and optimize them incrementally. It is desirable to find the changed logic as small as possible in order to minimize the disturbance to the existing design. In exemplary embodiments, the LBSS methods described herein perform ECO synthesis and extract smallest changed logic, and are scalable therefore are suitable to large blocks.

Figure 16:
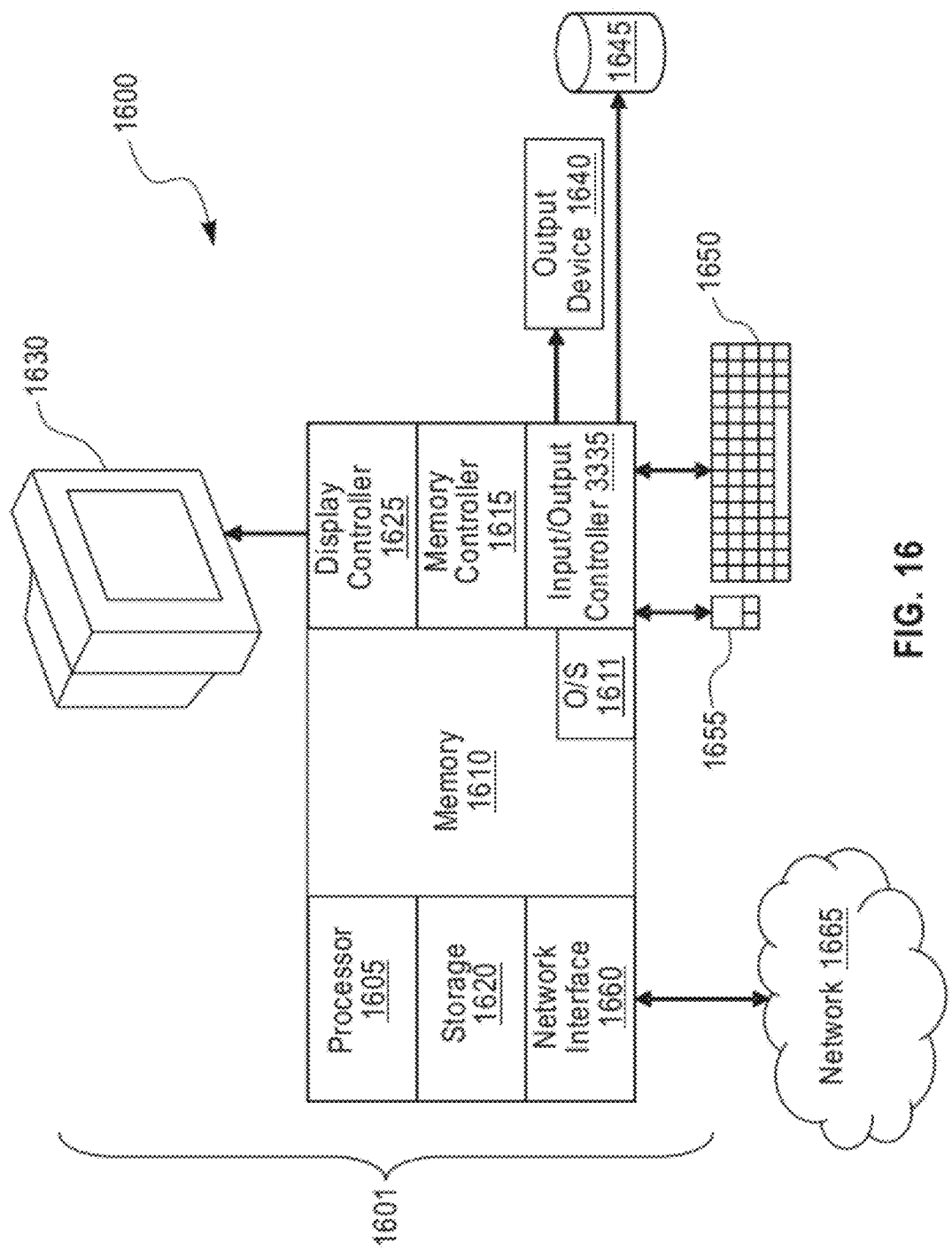
FIG. 16 illustrates an exemplary embodiment of a system that can be implemented for the large block synthesis and structured synthesis methods described herein.

FIG. 16 illustrates an exemplary embodiment of a system 1600 that can be implemented for the LBSS methods described herein. The methods described herein can be implemented in software (e.g., firmware), hardware, or a combination thereof. In exemplary embodiments, the methods described herein are implemented in software, as an executable program, and is executed by a special or general-purpose digital computer, such as a personal computer, workstation, minicomputer, or mainframe computer. The system 1600 therefore includes general-purpose computer 1601.

In exemplary embodiments, in terms of hardware architecture, as shown in FIG. 16, the computer 1601 includes a processor 1605, memory 1610 coupled to a memory controller 1615, and one or more input and/or output (I/O) devices 1640, 1645 (or peripherals) that are communicatively coupled via a local input/output controller 1635. The input/output controller 1635 can be, but is not limited to, one or more buses or other wired or wireless connections, as is known in the art. The input/output controller 1635 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 1605 is a hardware device for executing software, particularly that stored in memory 1610. The processor 1605 can be any custom made or commercially available processor, a central processing unit (CPU), an auxiliary processor among several processors associated with the computer 1601, a semiconductor based microprocessor (in the form of a microchip or chip set), a macroprocessor, or generally any device for executing software instructions.

The memory 1610 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 1610 may incorporate electronic, magnetic, optical, and/or other types of storage media. Note that the memory 1610 can have a distributed architecture, where various components are situated remote from one another, but can be accessed by the processor 1605.

The software in memory 1610 may include one or more separate programs, each of which comprises an ordered listing of executable instructions for implementing logical functions. In the example of FIG. 16, the software in the memory 1610 includes the LBSS methods described herein in accordance with exemplary embodiments and a suitable operating system (OS) 1611. The operating system 1611 essentially controls the execution of other computer programs, such the LBSS systems and methods as described herein, and provides scheduling, input-output control, file and data management, memory management, and communication control and related services.

The LBSS methods described herein may be in the form of a source program, executable program (object code), script, or any other entity comprising a set of instructions to be performed. When a source program, then the program needs to be translated via a compiler, assembler, interpreter, or the like, which may or may not be included within the memory 1610, so as to operate properly in connection with the OS 1611. Furthermore, the LBSS methods can be written as an object oriented programming language, which has classes of data and methods, or a procedure programming language, which has routines, subroutines, and/or functions.

In exemplary embodiments, a conventional keyboard 1650 and mouse 1655 can be coupled to the input/output controller 1635. Other output devices such as the I/O devices 1640, 1645 may include input devices, for example but not limited to a printer, a scanner, microphone, and the like. Finally, the I/O devices 1640, 1645 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 1600 can further include a display controller 1625 coupled to a display 1630. In exemplary embodiments, the system 1600 can further include a network interface 1660 for coupling to a network 1665. The network 1665 can be an IP-based network for communication between the computer 1601 and any external server, client and the like via a broadband connection. The network 1665 transmits and receives data between the computer 1601 and external systems. In exemplary embodiments, network 1665 can be a managed IP network administered by a service provider. The network 1665 may be implemented in a wireless fashion, e.g., using wireless protocols and technologies, such as WiFi, WiMax, etc. The network 1665 can also be a packet-switched network such as a local area network, wide area network, metropolitan area network, Internet network, or other similar type of network environment. The network 1665 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 1601 is a PC, workstation, intelligent device or the like, the software in the memory 1610 may further include a basic input output system (BIOS) (omitted for simplicity). The BIOS is a set of essential software routines that initialize and test hardware at startup, start the OS 1611, and support the transfer of data among the hardware devices. The BIOS is stored in ROM so that the BIOS can be executed when the computer 1601 is activated.

When the computer 1601 is in operation, the processor 1605 is configured to execute software stored within the memory 1610, to communicate data to and from the memory 1610, and to generally control operations of the computer 1601 pursuant to the software. The LBSS described herein and the OS 1611, in whole or in part, but typically the latter, are read by the processor 1605, perhaps buffered within the processor 1605, and then executed.

When the systems and methods described herein are implemented in software, as is shown in FIG. 16, the methods can be stored on any computer readable medium, such as storage 1620, for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In exemplary embodiments, where the LBSS methods are implemented in hardware, the LBSS described herein can implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects include: 1) The ability for synthesis to implement high performance logic previously possible with manual design effort by automatically deriving the structure in synthesis and using that structure in a large logic netlist to implement it efficiently with significantly higher quality of results; 2) The ability for synthesis to be deterministically controlled with a designer specified structure for critical logic portions to be implement a large high performance logic netlist; 3) The ability for automated synthesis to derive the structured logic portions and implement them in a structured way physically within a large block by multitude of techniques that are efficient in effort and quality; and 4) The ability for synthesis to implement very large logic designs that can yield very high performance (for example to meet the need of 90% of the highest performance microprocessor logic design).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer implemented method for large block and structured synthesis, the method comprising:
    determining initial design data from starting points for a synthesis flow;
    receiving user-directed structuring is incorporated into the synthesis flow;
    applying logical synthesis on the initial design data;
    applying a physical design on the initial design data, including identifying and extracting datapaths in the physical design, and legalizing the datapaths to prevent datapath overlap;
    placing the datapaths within the initial design data;
    recovering area from the initial design, which is available after the datapaths are placed;
    determining whether circuit design parameters have been met; and
    in response to circuit design parameters not being met, adjusting the circuit design parameters.

2. The method as claimed in claim 1 wherein the starting points include top-down partitioning and bottom-up macro merging.

3. The method as claimed in claim 1 wherein adjusting circuit design parameters comprises restructuring the register transfer level definition.

4. The method as claimed in claim 1 wherein applying the physical design comprises applying pre-designed hardware to the synthesis flow.

5. The method as claimed in claim 1 further comprising in response to a determination of late design changes to the initial design data, applying engineering change orders to the initial design data.

6. The method as claimed in claim 1 wherein user-directed structuring includes constraints to the synthesis flow.

7. The method as claimed in claim 1 wherein applying a physical design on the initial design data comprises applying movebounds to the synthesis flow.

8. The method as claimed in claim 1 wherein applying a physical design on the initial design data comprises generating placement of gates on the initial design data.

9. The method as claimed in claim 1 wherein applying a physical design on the initial design data comprises performing clock tree synthesis on the initial design data.

10. The method as claimed in claim 1 wherein applying a physical design on the initial design data comprises performing in-place optimization on the synthesis flow to meet timing and electrical restraints on the initial design data.

11. The method as claimed in claim 1 wherein applying a physical design on the initial design data comprises:
    performing routing to place wires into the initial design data; and
    performing routing-based optimization to re-optimize timing based on parasitics extracted after routing.

12. A computer program product for large block and structured synthesis, the computer program product including a non-transitory computer readable medium having instructions for causing a computer to implement a method, the method comprising:
    determining initial design data from starting points for a synthesis flow;
    receiving user-directed structuring is incorporated into the synthesis flow;
    applying logical synthesis on the initial design data;

applying a physical design on the initial design data, including identifying and extracting datapaths in the physical design, and legalizing the datapaths to prevent datapath overlap;

placing the datapaths within the initial design data;

recovering area from the initial design, which is available after the datapaths are placed;

determining whether circuit design parameters have been met; and in response to circuit design parameters not being met, adjusting the circuit design parameters.

13. The computer program product as claimed in claim 12 wherein the starting points include top-down partitioning and bottom-up macro merging.

14. The computer program product as claimed in claim 12 wherein adjusting circuit design parameters comprises restructuring the register transfer level definition.

15. The computer program product as claimed in claim 12 wherein applying the physical design comprises applying pre-designed hardware to the synthesis flow.

16. The computer program product as claimed in claim 12 wherein the method further comprises in response to a determination of late design changes to the initial design data, applying engineering change orders to the initial design data.

17. The computer program product as claimed in claim 12 wherein user-directed structuring includes constraints to the synthesis flow.

18. The computer program product as claimed in claim 12 wherein applying a physical design on the initial design data comprises applying movebounds to the synthesis flow.

19. The computer program product as claimed in claim 12 wherein applying a physical design on the initial design data comprises generating placement of gates on the initial design data.

20. The computer program product as claimed in claim 12 wherein applying a physical design on the initial design data comprises performing clock tree synthesis on the initial design data.

21. The computer program product as claimed in claim 12 wherein applying a physical design on the initial design data comprises performing in-place optimization on the synthesis flow to meet timing and electrical restraints on the initial design data.

22. The computer program product as claimed in claim 12 wherein applying a physical design on the initial design data comprises:

performing routing to place wires into the initial design data; and performing routing-based optimization to re-optimize timing based on parasitics extracted after routing.

* * * * *